United States Patent [19]

Harrington

[11] 4,310,569

[45] Jan. 12, 1982

[54] METHOD OF ADHESION OF PASSIVATION LAYER TO GOLD METALIZATION REGIONS IN A SEMICONDUCTOR DEVICE

[75] Inventor: Alan L. Harrington, Glendale, Calif.

[73] Assignee: TRW Inc., Los Angeles, Calif.

[21] Appl. No.: 128,622

[22] Filed: Mar. 10, 1980

[51] Int. Cl.³ .................. H01L 21/48; H01L 21/283
[52] U.S. Cl. ...................................... 427/89; 156/664; 156/665; 427/91; 427/125; 427/90; 430/313
[58] Field of Search .................. 357/71, 67; 427/88, 427/89, 90, 125, 376.2, 93, 383.9; 29/590; 156/664, 665; 430/315

[56] References Cited

U.S. PATENT DOCUMENTS

| 3,567,508 | 3/1971 | Cox et al. | 357/67 X |
| 3,717,563 | 2/1973 | Revitz et al. | 357/71 X |
| 3,832,230 | 8/1974 | Terry | 427/89 |

OTHER PUBLICATIONS

Romankiw "Depositing Adhesion Layers for Contact Between Noble Metals and Dielectric Material", IBM Tech. Disclosure Bulletin, vol. 18, No. 5, Oct., 1975. pp. 1635–1638.

Primary Examiner—John D. Smith
Assistant Examiner—Bernard F. Plantz
Attorney, Agent, or Firm—Martin R. Horn

[57] ABSTRACT

A method for adhering a passivation layer to gold regions in a semiconductor device. The method comprises the steps of providing a semiconductor device having at least one gold region formed thereon. A layer of a metal reactive with the gold is then deposited over the gold region so as to form a gold-reactive metal interface region. The gold and metal are then reacted at the interface region. Any metal which does not react is removed so as to expose a reacted interface region. Finally, a layer of passivation material is deposited over the exposed reacted interface region. Because the passivation material is then in contact with reacted gold regions, its adherence thereto is substantially increased.

5 Claims, 4 Drawing Figures

METHOD OF ADHESION OF PASSIVATION LAYER TO GOLD METALIZATION REGIONS IN A SEMICONDUCTOR DEVICE

BACKGROUND OF THE INVENTION

1. Field of the Invention

This invention relates to the field of semiconductor fabrication technology, and more specifically, to a method of adhering a passivation layer to a gold metalization region in a semiconductor device.

2. Description of the Prior Art

It is basic to the fabrication of semiconductor devices that a passivation layer be deposited over the surface of the completed device so as to protect it from contaminants, moisture or particles which could affect the operation of the device. In addition, the passivation layer is used to control the surface states of the semiconductor to insure uniform behavior of the device. The passivation layer is usually an oxide of the semiconductor, such as $SiO_2$ and $Al_2O_3$. However, other materials such as $Si_3N_4$ are also used.

It is also well recognized in the field of integrated circuit semiconductor fabrication technology that gold has many desirable electrical properties which make it suitable for use as a metallization region. For example, gold has low resistivity which facilitates the transmission of high current densities through a thin layer of gold. However, gold does not adhere well to silicon dioxide or other passivation materials, which makes it difficult to be employed directly as the first level of metal contacts in semiconductor devices, and particularly in metalization regions. Even so, gold has been used to form integrated circuit devices. In LSI (large scale integrated circuits), multi-layer metalization is required in the integrated circuit structure. In order for the multi-layer metalization to be effective when gold is used, there must be a layer of passivation, such as glass, between the gold layers. This has led to a number of problems including the separation of two or more layers of gold. This is believed to be due to lack of satisfactory adherence of the passivation layer to be gold. Failure of the passivation layer to adhere satisfactorily to the gold causes the passivation layer to peel or flake off thereby resulting in device failure. This problem becomes especially severe when large areas of gold are to be passivated. As a result of this nonadherence, the passivation layer on the gold metalization region is also vulnerable to cracks or fractures in its surface, which can also result in device failure.

Yet another problem relates to the bonding of contact leads to the gold metalization on the semiconductor wafer. Typically, the passivation layer is applied over the entire surface of the semiconductor including the gold metalization regions. Then, in order to electrically connect leads to the gold metalization contacts, a sufficient amount of the passivation layer over the gold metalization regions is removed to allow a bond to be made. This method of making contact to the gold metalization regions is used primarily in large scale integration (LSI) technology where multiple layers of gold may be deposited on one semiconductor wafer. The removal of the passivation layer overlying the gold metalization region is usually accomplished by means of a wet etching and masking process which selectively removes the passivation material in certain desired regions. A problem with this is that when a passivation layer is used which does not adhere well to the gold, the wet etching step will, in addition to removing the passivation layer, also tend to remove some of the passivation material which is situated long the gold-passivation material interface. This results in the "undermining" of the passivation material. Such undermining can lead to the separation of the passivation layer from the underlying gold layer, resulting in unreliability or failure of the device.

The art, in recognition of the benefits of using gold, but aware of the problem with its poor adherence to passivation layers, has devised a number of bonding techniques. One prior art method of adhering gold to an insulating layer is set forth in U.S. Pat. No. 3,832,230. In the method disclosed, metal film such as tantalum, zirconium, niobium or hafnium is deposited on the gold metalization contact region. The metal film is then heated in an oxidizing atmosphere to form an oxide. A layer of glass is deposited over the metal oxide layer. The glass adheres to the oxide which in turn adheres to the gold. This method is somewhat effective in preventing the cracking or separation of the passivation layer from the underlying gold regions. However, it necessitates heating the device in an oxidizing atmosphere to temperatures which can damage certain types of power transistors. For example, the reaction between tantalum and an oxidizing atmosphere will only take place at high temperatures. Without this oxidation treatment of the tantalum (or of the other metals mentioned above), the presence of the metal between the gold metalization contacts on the surface of the semiconductor will cause shorting of the contacts together, thereby causing the device to fail. Thus, in addition to heating, any residual unoxidized metal must be removed by a photo masking technique, which can substantially increase the price of manufacture. Yet another difficulty which results when this process is utilized is that the reactive metal normally tends to diffuse into the gold. This diffusion of metal into the gold tends to reduce the conductivity of the gold and thereby negates one of the purposes for using gold in the first place.

Another patent, U.S. Pat. No. 3,717,563, discloses a method for alleviating the gold-passivation problem by utilizing a beta tantalum instead of body centered cubic tantalum. When beta tantalum is used to form a sandwich with the gold contact layer, improvements are allegedly obtained. However, this method does not relieve the need to heat the device, and requires that multiple layers be formed.

It is therefore an objective of the present invention to provide a method for adhering gold to a passivation layer without requiring the heating of the entire device. The method of present invention achieves this and other objectives and therefore represents an advancement in the art of semiconductor manufacturing techniques.

BRIEF DESCRIPTION OF THE INVENTION

The present invention method calls for predefined gold metalization contact regions to be formed on a semiconductor device. Typically, such regions are formed by photoresistively bonding the gold to those areas in which leads or other electrical contacts are to be bonded. Next, a metal which is reactive with the gold, such as aluminum, is deposited by means of sputtering techniques or the like directly onto the surface of the device, covering the gold metalization contact regions. The aluminum metal is allowed to react with the exposed gold contacts. The semiconductor device is then chemically etched which removes any aluminum metal which has not reacted with the gold. The etching step is allowed to proceed until the unreacted aluminum is completely removed, and the gold which has reacted with the aluminum is exposed. A passivation layer, such as $SiO_2$ or the like, is then deposited atop the gold-aluminum metalization contacts. The passivation adheres tightly to the gold-aluminum contacts, thereby ensuring device reliability. The passivation layer may be selectively removed by well known photo-resist mask and etching techniques in the area over the gold-aluminum contacts or unreacted gold contacts which enables electrical connections to be bonded thereto.

DETAILED DESCRIPTION OF THE DRAWINGS

Figure 1:
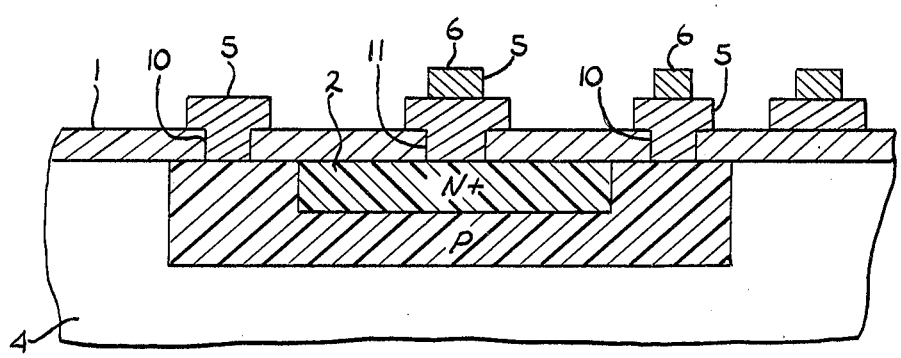
FIG. 1 is a cross-sectional view of a semiconductor showing a plurality of gold contact regions.

Referring to the drawings, and particularly to FIG. 1, there is shown a substrate 4 of a semiconductor material such as silicon of N-type conductivity. Substrate 4 can function as a collector of a transistor as is well recognized in the prior art. A P-type region 3 is formed in the substrate 4 by diffusion in the well known manner through an opening in a layer 1 of a passivation material such as silicon dioxide. Region 3 functions as the base of the transistor.

After reoxidization to close the openings used for diffusion into the P-type region 3, an N-plus region 2 is formed in region 3 by diffusion in the well known manner through another opening formed in layer 1. Region 2 can function as the emitter of the transistor. The method of formation of regions 2 and 3, as well as the formation of layer 1 will not be further discussed in any great detail herein as such as well recognized in the prior art.

In typical semiconductor device manufacturing techniques, after region 2 is formed, openings 10 and 11 are formed in layer 1 so as to expose selected areas in regions 2 and 3, respectively. Gold metalization contact regions 5 are then formed in these openings such as by sputter technique and the like.

To form the gold metalization contacts in the preferred method of the present invention, a photo-resistive material 6 is deposited on the gold contact regions 5. Preferably only those areas of the contact regions 5 which are to be accessible through the passivation layer, as hereinbelow described, are masked with photo-resistive material 6 using recognized photo-resist masking techniques.

Figure 2:
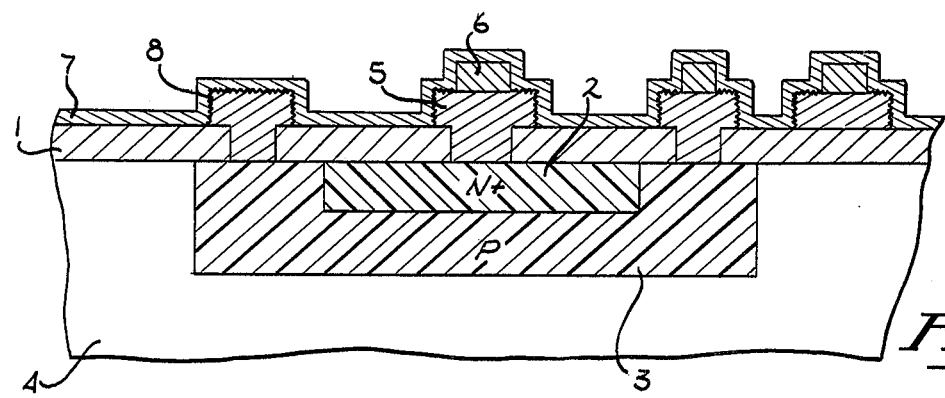
FIG. 2 is a cross-sectional view of a semiconductor showing the application of a metal over the gold regions.

As can be seen in FIG. 2, there is deposited over the entire surface 30 of layer 1, including the gold metalization contact regions 5 and layer 6, a metal layer 7, such as aluminum, titanium, zirconium, chromium, or molybdenum, which is reactive with gold. The reactive metal layer is deposited using DC sputtering techniques or the like. Sufficient thickness of reactive metal layer 7 is sputtered onto the gold metalization contact regions 5 such that the metal reacts with the gold, forming a gold-reactive metal interface 8. In those regions of the gold contact regions 5 where the photo-resist material 6 is located, there is no reaction between the gold and the metal layer 7.

Figure 3:
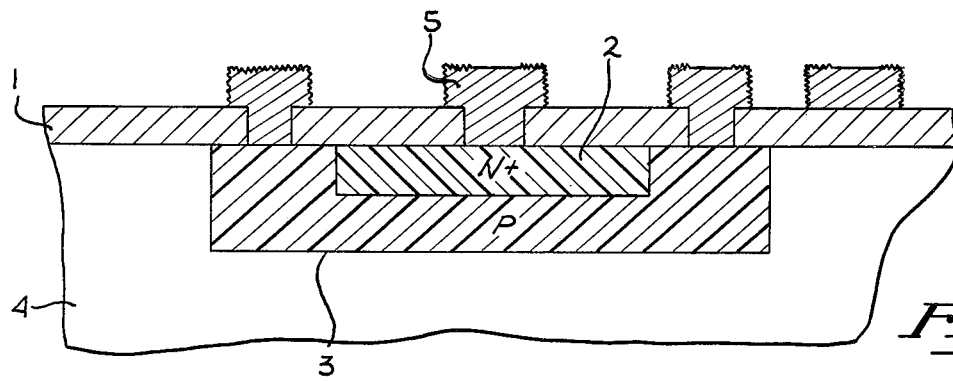
FIG. 3 is a cross-sectional view of a semiconductor showing the removal of unreacted metal as well as those areas in the gold regions which have now reacted with the metal.
Figure 4:
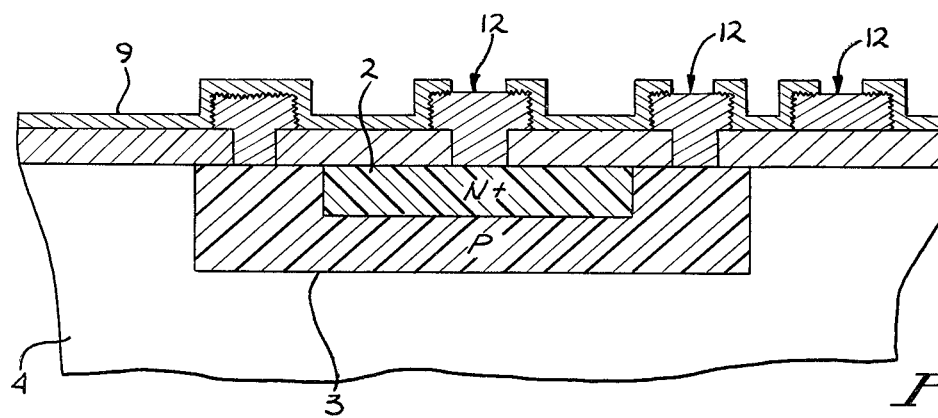
FIG. 4 is a cross-sectional view of a semiconductor showing the application of an upper layer of passivation, as well as the formation of openings in the passivation layer so as to expose specific gold contact regions.

Subsequently, the reactive metal layer 7 is selectively removed (FIG. 3) using a chemical etch which does not attack the gold contact regions 5. In addition, the photo-resistive mask 6 is also removed, leaving behind the gold contacts 5, which have selected areas where no reaction with the metal 7 has taken place. A passivation layer 9 (FIG. 4) may now be applied with excellent adhesion to the gold contacts 5. The increase in adhesive qualities is believed to be due to the fact that the passivation material more readily bonds to the gold-reactive metal interface regions 8.

After application of the layer 9, a plurality of openings 12 may be made using well known photo-resist and masking techniques to remove the passivation material 6 over selected gold contact regions 5.

One of the advantages of the above described method is that it is unnecessary to remove the adhesion material from between the contacts using the photo-resistive process as was the case in the prior art. Further, adhesion in the contact regions between the gold and passivation is not required because the passivation is removed in order to expose the gold contact regions through the openings 12.

Yet a further advantage of the present method is that it permits one to apply a reactive metal to gold, and allows the selective removal of the unreactive metal without employing very exacting photo-resist techniques. The present method also promotes excellent adhesion of passivation to large areas of gold as well as to submicron gold areas. In addition, there is a demonstrated increase in MTBF (mean time between failures) due to excellent adhesion of the passivation layer, even where the gold layer starts to melt. This excellent adhesion considerably inhibits metal migration.

It should be understood that while the preferred embodiment described herein has been described with reference to particular metals and steps, it will be apparent to those skilled in the art that other changes and modifications can be made without departing from the spirit or scope of the present invention.

I claim:

1. A method for adhering a passivation layer to gold regions in a semiconductor device, comprising the steps of:
   (a) providing a semiconductor device having at least one gold region formed thereon;
   (b) selectively depositing a layer of a metal, which is reactive with said gold region, over said gold region, so as to form a gold-reactive metal interface;
   (c) reacting said gold with said metal at said interface;
   (d) removing substantially all of the unreacted portions of the metal so as to expose the reacted interface; and
   (e) depositing a layer of passivation material over the reacted interface.

2. The method of claim 1 including the step of selectively removing part of said passivation layer so as to expose a gold region in which no reaction with said reactive metal has taken place.

3. A method for adhering a passivation layer to gold regions in a semiconductor device comprising the steps of:

providing a semiconductor device having at least one gold region formed thereon;

applying a mask to selected portions of said at least one gold region;

depositing a layer of metal which is reactive with gold over said mask and said at least one gold region;

reacting said metal with the areas said at least one gold region which are not covered by the mask;

removing substantially all of the unreacted portions of said metal layer and said mask;

depositing a layer of passivation material over said at least one gold region, wherein said passivation layer adheres strongly to the reacted portion of said at least one gold region; and removing the portion of the passivation layer covering the previously masked portions of said at least one gold region.

4. The method of claims 1, 2 or 3 wherein the reactive metal is selected from the group consisting of Al, Ti, Zr, Cr and Mb.

5. A method for adhering a passivation layer to gold regions in a semiconductor device, comprising the steps of:

(a) providing a semiconductor device having a plurality of gold regions formed thereon;

(b) applying a removable masking material over selected portions of the gold regions;

(c) depositing a layer of a metal which is reactive with said gold over said gold regions so as to form gold-reactive metal interfaces, wherein said reactive metal is selected from the group consisting of Al, Ti, Zr, Cr and Mb;

(d) reacting said gold with said metal at said interfaces;

(e) removing substantially all of the remaining metal and the removable masking material so as to expose the reacted interfaces and gold regions originally covered by the masking material where no reaction with the metal has taken place;

(f) depositing a layer of passivation material over the exposed reacted interface regions and exposed gold regions; and (g) selectively removing part of said passivation layer so as to expose said gold regions where no reaction has taken place.

* * * * *